United States Patent

Hearn

[15] 3,668,538

[45] June 6, 1972

[54] FAST SLEWING OPERATIONAL AMPLIFIER

[72] Inventor: William E. Hearn, Atherton, Calif.

[73] Assignee: Signetics Corporation, Sunnyvale, Calif.

[22] Filed: Feb. 19, 1970

[21] Appl. No.: 12,709

[52] U.S. Cl. ................................................330/9, 330/30 D

[51] Int. Cl. ..........................................................H03f 1/02

[58] Field of Search ..................307/228, 229, 230; 328/127; 330/30 D

[56] References Cited

UNITED STATES PATENTS

| | | | |
|---|---|---|---|
| 3,479,534 | 11/1969 | Miller | 307/229 X |
| 3,440,448 | 4/1969 | Dudley | 328/127 X |
| 3,290,562 | 12/1966 | Faulkner et al. | 328/127 X |
| 3,535,556 | 10/1970 | Hall | 307/228 X |
| 3,484,593 | 12/1969 | Schmoock et al | 307/229 X |

*Primary Examiner*—Nathan Kaufman
*Attorney*—Flehr, Hohbach, Test, Albritton & Herbert

[57] ABSTRACT

A fast slewing operational amplifier having as an output stage an inverting integrator and as an input stage a differential amplifier. The output current of the differential amplifier varies in accordance with the differential input voltage to cause the integrator stage to slew in an exponential manner. The differential amplifier includes two pairs of complementary transistors with their emitters cross-coupled.

5 Claims, 4 Drawing Figures

PATENTED JUN 6 1972

3,668,538

INVENTOR
WILLIAM E. HEARN
BY
Flehr, Hohbach, Test, Albritton & Herbert
ATTORNEYS

FAST SLEWING OPERATIONAL AMPLIFIER

BACKGROUND OF THE INVENTION

The present invention is directed in general to a fast slewing operational amplifier and more particularly to an operational amplifier where the input stage provides an output current suitable for fast slewing.

In prior operational amplifiers the limited dynamic range of the input stage reduced the amplifier slewing rate; in other words, the rate of change of the output in response to a change in input. The normal output stage of an operational amplifier is an inverting integrator to which the input stage is coupled.

The normal output or drive current provided by an input stage is determined by the quiescent current which is a constant value. Thus, the slew rate is limited by this value. If the quiescent current is increased, a resultant undesirable increase in offset voltage occurs.

If it is attempted to increase the drive current above the quiescent value, the output conductance of the input stage is lowered necessitating an increase in the capacitance of the integrating output stage to maintain circuit stability. Such increase in capacitance, however, nullifies any increase in slew rate which would normally occur with an increase in drive current.

OBJECT AND SUMMARY OF THE INVENTION

It is, therefore, a general object of the invention to provide an improved fast slewing operational amplifier.

It is another object of the invention to provide an operational amplifier having an input stage which provides increased drive current but maintains its other essential operating characteristics.

In accordance with the above objects there is provided a fast slewing operational amplifier comprising differential amplifier means for providing an output current in response to a differential input voltage. The amplifier has a predetermined quiescent current and a substantially proportional output characteristic where the output current is substantially related to the voltage input by a constant to provide an output current significantly greater than the quiescent current. The differential amplifier also has a substantially constant output conductance throughout its range of operation. Integrating means are coupled to the differential amplifier means and responsive to a change in the output current of the differential amplifier to provide a corresponding change in input voltage of the integrating means.

DETAILED DESCRIPTION OF THE PREFERRED EMBODIMENT

Figures 1, 2, 3, 4:
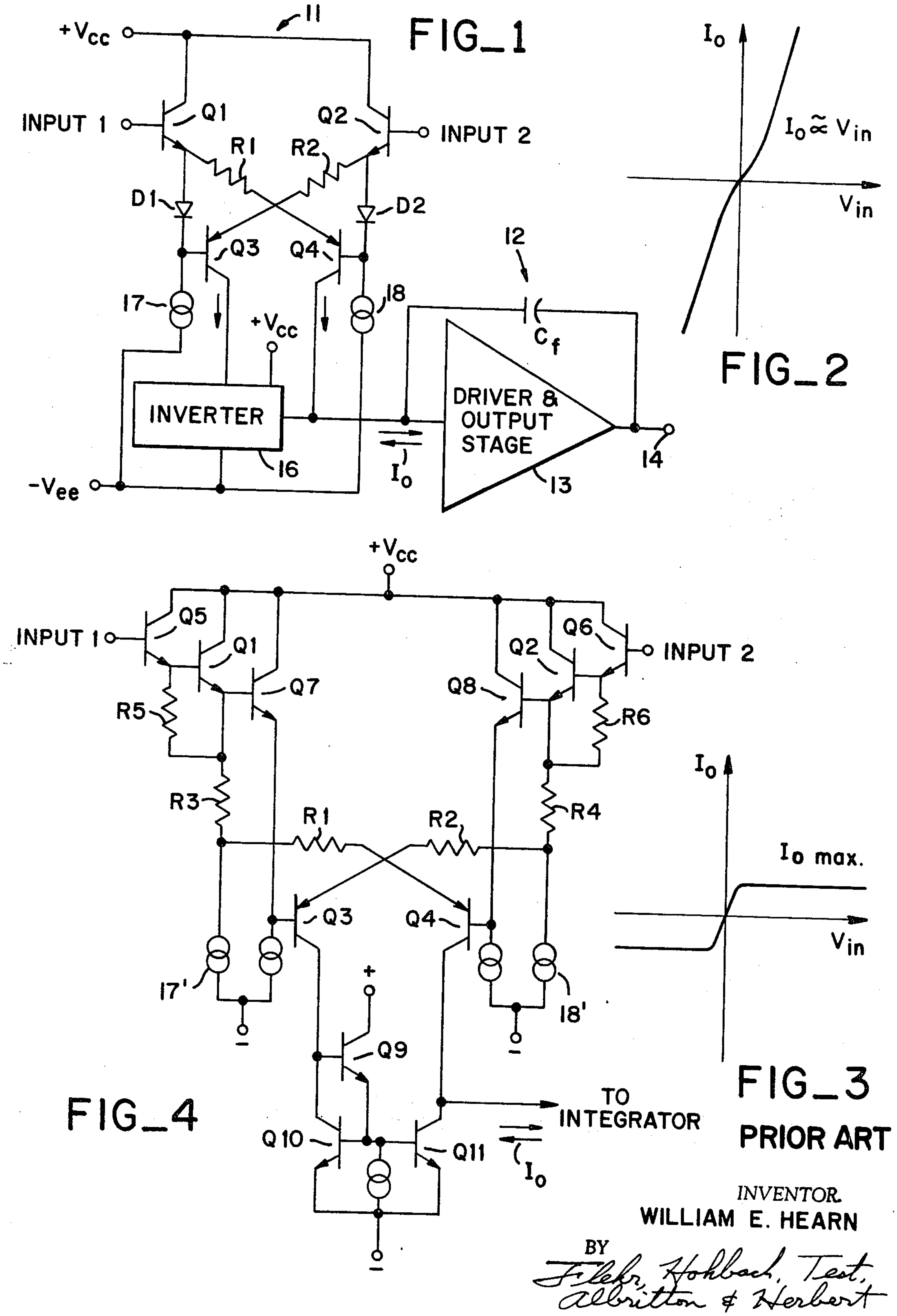
FIG 1, FIG 2, FIG 3 PRIOR ART, FIG 4
FIG. 1 is a circuit schematic of an operational amplifier embodying the present invention.
FIG. 2 is a characteristic curve showing the operation of the circuit of FIG. 1.
FIG. 3 is a characteristic curve illustrating the operation of a prior art circuit.
FIG. 4 is a circuit schematic similar to FIG. 1 but having modifications for making it suitable for integration.

Referring first to FIG. 1, the operational amplifier includes an input stage 11 having an output current $I_o$ which is coupled to and drives an inverter integrator 12. Integrator 12 includes a driver and output stage 13 with a feedback capacitor $C_f$. This provides an output voltage at the terminal 14 in response to a differential voltage between input 1 and input 2 of stage 11.

Input stage 11 is of a differential amplifier type. It includes a first pair of transistors of one carrier type having a pair of transistors of one carrier type having a pair of base input terminals for receiving the differential input voltage from inputs 1 and 2. Specifically, these are NPN transistors Q1 and Q2. The collectors of the transistors are coupled to a collector voltage supply $+V_{cc}$. A second pair of PNP transistors Q3 and Q4 which, of course, are of the opposite carrier type to Q1 and Q2 are respectively coupled to Q1 and Q2. Specifically, the emitter of Q1 is coupled to the base of Q3 through a diode D1 and the emitter of Q2 to the base of Q4 through a diode D2. Thus, with Q1 conducting the positive voltage on the base of Q3 places Q3 is a nonconductive condition. Similarly, with Q2 conducting the positive voltage from the collector supply prevents the conduction of Q4. Transistor Q1 and Q2 are connected as common collector type amplifiers and Q3 and Q4 as common base types.

In accordance with the invention the emitter output terminal of Q1 is coupled through a series connected resistor R1 to the emitter output terminal of transistor Q4; similarly, the emitter of Q2 is coupled through resistor R2 to the emitter of Q3. Thus, the first and second pairs of transistors Q1 through Q4 are cross coupled with each other. Moreover, this is a complementary type of cross coupling since the respective transistors are of different types. Such cross coupling is a type of positive feedback where when, for example, transistor Q1 is conducting, conduction in Q4 is allowed. However, at the same time, conduction of Q1 maintains Q3 in an off condition which prevents conduction of Q2.

The collector output of Q4 is coupled to the input of integrator stage 12. The collector output of Q3 is coupled through an inverter 16 and then to the input of inverter integrator stage 12. This, thus, provides an output current of input stage 11 designated $I_o$ of either a plus or minus polarity.

Proper biasing in the circuit of FIG. 1 is provided by diodes D1 and D2 and also by the constant current generators 17 and 18 which are between the base inputs of transistors Q3 and Q4 and the $-V_{EE}$ voltage supply.

In operation, the circuit of FIG. 1 with a ground on input 2 and a positive voltage on input 1 causes a voltage drop across R1 which will substantially be the positive voltage on input 1. Q1 is conducting and Q4 provides a current $I_o$ to the input of generator stage 12. Q2 and Q3 are off as discussed above.

With a negative voltage on input 1 and ground on input 2, Q1 is off and Q2 on. The voltage across R2 is therefore the differential voltage between input 1 and 2. Q3 is on to provide an output collector current to inverter 16 which inverts such current and applies it to the output. The inverter output current, $I_o$, is in a direction out of the integrator stage 12 when supplied by Q3, and $I_o$, when supplied by Q4, is in a direction into the integrator stage 12.

The foregoing circuit arrangement provides a characteristic curve as shown in FIG. 2 which relates the differential input voltage, $V_{in}$, between inputs 1 and 2 to the output current $I_o$ of stage 11. This is substantially a proportional relationship; in other words, the $I_o$ is related to $V_{in}$ by substantially a constant. Specifically, the output current $I_o$ is essentially determined by the input voltage $V_{in}$ divided by resistance R1 or R2. This type of design provides for a nearly linear relationship without introducing excessive input offset voltage and maintains the output conductance of stage 11. Moreover the slew rate is exponential since the output current on $I_o$ can increase as input voltage, $V_{in}$, increases. In contrast in the prior art as illustrated in FIG. 3 where the output current $I_0$ reaches a saturation maximum, slew rate is a constant since integration of a horizontal curve, of course, is a ramp. In the case of FIG. 2, integration of the already sloping characteristic provides an exponential function. Thus, the improvement in the slew rate is significant compared to the prior art.

In fact, the amplifier of the present invention achieves slew rates in excess of 40 volts per microsecond in any gain configuration and settles rapidly with less than 10 percent overshoot. Gain is in excess of 100 decibels. The above is also accomplished without any increase in quiescent current which, of course, increases offset voltage. In comparison, with a standard differential amplifier configuration having an output characteristic as illustrated in FIG. 3, a quiescent current increase would, of course, increase $I_o$ max with an attendant undesirable increase in offset voltage.

The circuit of FIG. 4 shows only the input stage of FIG. 1 but has been modified to make it suitable for integration. It includes additional input transistors Q5 and Q6 which serve as emitter followers to increase the input impedance. Transistors Q7 and Q8 serve the same purpose as diodes D1 and D2. Current generators 17' and 18' are equivalent to the similarly numbered generators of FIG. 1.

Resistors R3 and R4 along with resistors R5 and R6 are for the purpose of additional biasing. In addition, of course, the cross coupling between transistors Q1 and Q4 now consists of series connected resistors R1 and R3 and for the cross coupling between transistors Q2 and Q3 resistors R2 and R4.

Lastly, the details of the inverter stage have been illustrated and consist of three transistors Q9, Q10 and Q11 coupled together in a manner well known in the art.

Thus, the present invention provides an improved operational amplifier with a fast slew rate which has an input stage providing increased drive current but which maintains its other essential operating characteristics such as output conductance and offset voltage.

I claim:

1. A fast slewing operational amplifier comprising: differential amplifier means for providing an output current in response to a differential input voltage said amplifier having a predetermined quiescent current said amplifier having a substantially proportional output characteristic where said output current is substantially related to said voltage input by a constant to provide an output current significantly greater than said quiescent current said differential amplifier also having a substantially constant mutual conductance throughout its range of operation said differential amplifier including two pairs of complementary transistors each having emitter and collector type terminals the terminals of one type being cross-coupled; and integrating means coupled to said differential amplifier means responsive to a change in said output current to provide a corresponding change in output voltage of said integrating means.

2. A fast slewing operational amplifier as in claim 1 where said integrating means is of the inverting type where a positive change in input current produces a negative voltage change and vice versa.

3. A fast slewing operational amplifier as in claim 1 where said differential amplifier includes a first pair of transistors of one carrier type for receiving said differential input voltage, a second pair of transistors of the opposite carrier type respectively coupled to said first pair for providing said output current, and means for respectively cross-coupling the emitter terminals of said first transistor pair to the emitter terminal of a transistor of said second pair which is coupled to the other end of said first pair of transistors.

4. A fast slewing operational amplifier as in claim 3 where said cross-coupling means includes resistors.

5. A fast slewing operational amplifier comprising: differential amplifier means including, a first pair of transistors of one carrier type having a pair of base input terminals for receiving the differential input voltage, a second pair of transistors of the opposite carrier type coupled respectively to said first pair so that conductance of one of said first pair of transistors prevents conduction in the associated one of said second pair of transistors; means for coupling the emitter terminals of said first pair of transistors to the emitter terminals of the unassociated one of said second pair of transistors, conduction in said one of first pair of transistors allowing conduction in the cross-coupled one of said second pair of transistors and the associated one of said second pair of transistors preventing conduction of the cross-coupled one of said first pair of transistors the collector terminals of said second pair of transistors providing an output current, one of such terminals having a series connected inverter to selectively provide an output current of either polarity; and integrating means coupled to said differential amplifier means responsive to a change in said output current to provide a corresponding change in output voltage of said integrating means.

* * * * *